United States Patent
Xuan et al.

(10) Patent No.: US 11,239,214 B2
(45) Date of Patent: Feb. 1, 2022

(54) DISPLAY PANEL AND MANUFACTURING METHOD THEREOF, AND DISPLAY DEVICE

(71) Applicant: BOE Technology Group Co., Ltd., Beijing (CN)

(72) Inventors: Minghua Xuan, Beijing (CN); Xiaochuan Chen, Beijing (CN); Dongni Liu, Beijing (CN); Han Yue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 87 days.

(21) Appl. No.: 16/585,310

(22) Filed: Sep. 27, 2019

(65) Prior Publication Data
US 2020/0294975 A1    Sep. 17, 2020

(30) Foreign Application Priority Data

Mar. 12, 2019 (CN) .......................... 201910183959.6

(51) Int. Cl.
*H01L 25/075*    (2006.01)
*H01L 33/62*    (2010.01)
*H01L 27/12*    (2006.01)

(52) U.S. Cl.
CPC ...... *H01L 25/0753* (2013.01); *H01L 27/1214* (2013.01); *H01L 33/62* (2013.01); *H01L 2933/0066* (2013.01)

(58) Field of Classification Search
CPC . H01L 25/0753; H01L 33/62; H01L 27/1214; H01L 2933/0066; H01L 25/167; H01L 33/38
See application file for complete search history.

(56) References Cited

U.S. PATENT DOCUMENTS

| | | | |
|---|---|---|---|
| 9,472,734 B1 * | 10/2016 | Chen | ...................... H01L 33/502 |
| 10,658,392 B1 * | 5/2020 | Chen | ................ H01L 29/41733 |
| 2014/0339495 A1 * | 11/2014 | Bibl | ..................... H01L 25/0753 |
| | | | 257/13 |

(Continued)

FOREIGN PATENT DOCUMENTS

| | | |
|---|---|---|
| CN | 101609832 A | 12/2009 |
| CN | 103376939 A | 10/2013 |

(Continued)

OTHER PUBLICATIONS

First Office Action dated Sep. 30, 2020 for application No. CN201910183959.6 with English translation attached.

(Continued)

*Primary Examiner* — Victor A Mandala
(74) *Attorney, Agent, or Firm* — Nath, Goldberg & Meyer; Joshua B. Goldberg

(57) ABSTRACT

The present disclosure provides a display panel and a manufacturing method thereof, a display device. The display panel includes: a substrate; a plurality of driving electrodes and a micro light emitting diode located on a surface of the substrate, wherein respective electrodes of the micro light emitting diode are located at a side of the micro light emitting diode facing away from the substrate; and a plurality of driving wires respectively electrically coupling the respective electrodes of the micro light emitting diode to the plurality of driving electrodes.

14 Claims, 3 Drawing Sheets

(56) References Cited

U.S. PATENT DOCUMENTS

| | | | | |
|---|---|---|---|---|
| 2019/0067522 A1* | 2/2019 | Chang | ..................... | H01L 33/44 |
| 2019/0096864 A1* | 3/2019 | Huitema | ................. | H01L 24/25 |
| 2019/0267363 A1* | 8/2019 | Bower | ................ | H01L 25/0753 |
| 2019/0296202 A1* | 9/2019 | Chen | ..................... | B23K 35/262 |
| 2019/0319064 A1* | 10/2019 | Liao | ..................... | H01L 27/156 |
| 2020/0043400 A1* | 2/2020 | Chen | ........................ | G09G 3/22 |
| 2020/0219858 A1* | 7/2020 | Chang | ................ | H01L 33/0093 |
| 2020/0411492 A1* | 12/2020 | Ju | .......................... | H01L 33/44 |
| 2021/0151472 A1* | 5/2021 | Kang | ..................... | H01L 33/54 |

FOREIGN PATENT DOCUMENTS

| | | | |
|---|---|---|---|
| CN | 106206611 A | 12/2016 |
| CN | 107145854 A | 9/2017 |
| CN | 108597377 A | 9/2018 |

OTHER PUBLICATIONS

Third Office Action dated Jun. 17, 2021 corresponding to Chinese application No. 201910183959.6.

* cited by examiner

DISPLAY PANEL AND MANUFACTURING METHOD THEREOF, AND DISPLAY DEVICE

CROSS-REFERENCE TO RELATED APPLICATIONS

The present application claims the priority of Chinese Patent Application No. 201910183959.6, filed to Chinese Patent Office on Mar. 12, 2019, the contents of which are incorporated herein by reference in its entirety.

TECHNICAL FIELD

The present disclosure relates to the field of display technology, and in particular, relates to a display panel, a manufacturing method of the display panel, and a display device.

BACKGROUND

Micro light emitting diode includes transverse micro light emitting diode (its anode and cathode are located at a same side) and longitudinal micro light emitting diode (its anode and cathode are located at opposite sides). When the transverse micro light emitting diode is transferred from a growing base onto a substrate, the anode and cathode of the transverse micro light emitting diode need to be bonded correspondingly with driving electrodes on the substrate using a bonding process.

SUMMARY

According to an aspect of embodiments of the present disclosure, a display panel is provided, which includes: a substrate; a plurality of driving electrodes and a micro light emitting diode located on a surface of the substrate, where respective electrodes of the micro light emitting diode are located at a side of the micro light emitting diode facing away from the substrate; and a plurality of driving wires respectively electrically coupling the respective electrodes of the micro light emitting diode to the plurality of driving electrodes.

According to an embodiment of the present disclosure, the display panel further includes a buffer structure covering at least a portion of a sidewall of the micro light emitting diode, where the plurality of driving wires are located on a side of the buffer structure away from the sidewall of the micro light emitting diode, and a surface of at least part of the buffer structure facing the plurality of driving wires is a curved surface.

According to an embodiment of the present disclosure, a surface, facing the plurality of driving wires, of a part of the buffer structure contacting a joint between a surface of the micro light emitting diode facing away from the substrate and the sidewall of the micro light emitting diode is a curved surface.

According to an embodiment of the present disclosure, a surface, facing the plurality of driving wires, of a part of the buffer structure contacting a joint between the micro light emitting diode and the substrate is a curved surface.

According to an embodiment of the present disclosure, the substrate includes a base and a driving circuit layer, and the plurality of driving electrodes are located on a surface of the driving circuit layer facing away from the base.

According to an embodiment of the present disclosure, the display panel further includes a connection structure configured to fix the micro light emitting diode to the substrate, where the connection structure is located between the micro light emitting diode and the driving circuit layer, and an orthographic projection of the connection structure on the driving circuit layer covers an orthographic projection of the micro light emitting diode on the driving circuit layer.

According to an embodiment of the present disclosure, the display panel further includes an alignment electrode located on the surface of the driving circuit layer facing away from the base, where the alignment electrode is located within a range of the orthographic projection of the connection structure on the driving circuit layer.

According to an embodiment of the present disclosure, any one of the plurality of driving wires at least partly covers one of the respective electrodes to which the any one of the plurality of driving wires is electrically coupled and one of the plurality of driving electrodes corresponding to the one of the respective electrodes.

According to another aspect of embodiments of the present disclosure, a display device is provided, which includes the above display panel.

According to yet another aspect of embodiments of the present disclosure, a manufacturing method of the display panel is provided, which includes: forming a plurality of driving electrodes on a surface of a substrate; fixing a micro light emitting diode onto the surface of the substrate, where respective electrodes of the micro light emitting diode are located at a side of the micro light emitting diode facing away from the substrate; and forming a plurality of driving wires by employing a first patterning process, where the plurality of driving wires respectively electrically couple the respective electrodes of the micro light emitting diode to the plurality of driving electrodes correspondingly.

According to an embodiment of the present disclosure, the method further includes: before forming the plurality of driving wires by employing the first patterning process, forming a buffer structure above the substrate; where the buffer structure covers at least a portion of a sidewall of the micro light emitting diode, the plurality of driving wires are located on a side of the buffer structure away from the sidewall of the micro light emitting diode, and a surface of at least part of the buffer structure facing the plurality of driving wires is a curved surface.

According to an embodiment of the present disclosure, a surface, facing the plurality of driving wires, of a part of the buffer structure contacting a joint between a surface of the micro light emitting diode facing away from the substrate and the sidewall of the micro light emitting diode is a curved surface.

According to an embodiment of the present disclosure, a surface, facing the plurality of driving wires, of a part of the buffer structure contacting a joint between the micro light emitting diode and the substrate is a curved surface.

According to an embodiment of the present disclosure, before forming the plurality of driving electrodes on the surface of the substrate, the method further includes: forming a driving circuit layer on a base to form the substrate; where forming the plurality of driving electrodes on the surface of the substrate includes: forming the plurality of driving electrodes on a surface of the driving circuit layer facing away from the base.

According to an embodiment of the present disclosure, the method further includes: before fixing the micro light emitting diode onto the surface of the substrate, forming a connection structure configured to fix the micro light emitting diode to the substrate on the surface of the driving circuit layer facing away from the base by employing a second patterning process, where an orthographic projection of the connection structure on the driving circuit layer covers an orthographic projection of the micro light emitting diode on the driving circuit layer.

According to an embodiment of the present disclosure, fixing the micro light emitting diode onto the surface of the substrate includes: fixing the micro light emitting diode to the driving circuit layer via the connection structure by using a pattern of the connection structure as an alignment mark.

According to an embodiment of the present disclosure, fixing the micro light emitting diode onto the surface of the substrate includes: fixing the micro light emitting diode to the driving circuit layer via the connection structure by using the plurality of driving electrodes as an alignment mark.

According to an embodiment of the present disclosure, the method further includes: before forming the connection structure on the surface of the driving circuit layer facing away from the base by employing the second patterning process, forming an alignment electrode on the surface of the driving circuit layer facing away from the base, where the alignment electrode is located within a range of the orthographic projection of the connection structure on the driving circuit layer.

According to an embodiment of the present disclosure, fixing the micro light emitting diode onto the surface of the substrate includes: fixing the micro light emitting diode to the driving circuit layer via the connection structure by using the alignment electrode as an alignment mark.

According to an embodiment of the present disclosure, any one of the plurality of driving wires at least partly covers one of the respective electrodes to which the any one of the plurality of driving wires is electrically coupled and one of the plurality of driving electrodes corresponding to the one of the respective electrodes.

Reference signs are as follows: 1. base; 2. driving circuit layer; 3. micro light emitting diode; 4. electrode; 41. positive electrode; 42. negative electrode; 5. driving wire; 51. positive driving wire; 52. negative driving wire; 6. driving electrode; 61. positive driving electrode; 62. negative driving electrode; 7. buffer structure; 8. connection structure.

DETAILED DESCRIPTION

In order to allow those skilled in the art to better understand technical solutions of the present disclosure, the present disclosure will be described in further detail below in conjunction with the accompanying drawings and specific implementations.

After a micro light emitting diode is grown on a base, such as a sapphire base or a gallium arsenide base, it needs to be transferred and bonded to a backplane substrate of a light emitting device for driving the micro light emitting diode, so as to realize a display device. A related bonding method is to transfer the micro light emitting diode to a PCB (Printed circuit board) where solder pads have been coated with solder by means of dispensing or screen printing. However, compared with a solder pad of a diode having a size of 0.3 mm or larger, a solder pad of the micro light emitting diode has a size of only 20 um or 10 um, or even smaller than 10 um; and coating of solder inevitably suffers from a problem of alignment tolerance, which is usually 10 um or even more. Thus, when bonding a cathode and an anode of a transverse micro light emitting diode correspondingly with driving electrodes on the substrate, alignment precision of the bonding process is too low relative to the electrode size of the transverse micro light emitting diode, resulting in an excessively high defect rate of bonding.

Figure 1:
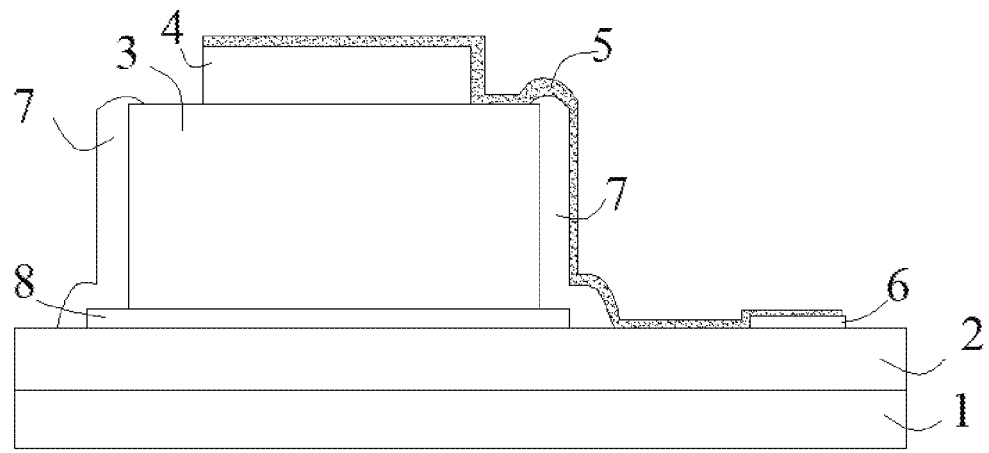
FIG. 1(a) is a schematic diagram of a cross-section of a display panel according to an embodiment of the present disclosure.
FIG. 1(b) is a top view of the display panel according to an embodiment of the present disclosure.
Figure 1:
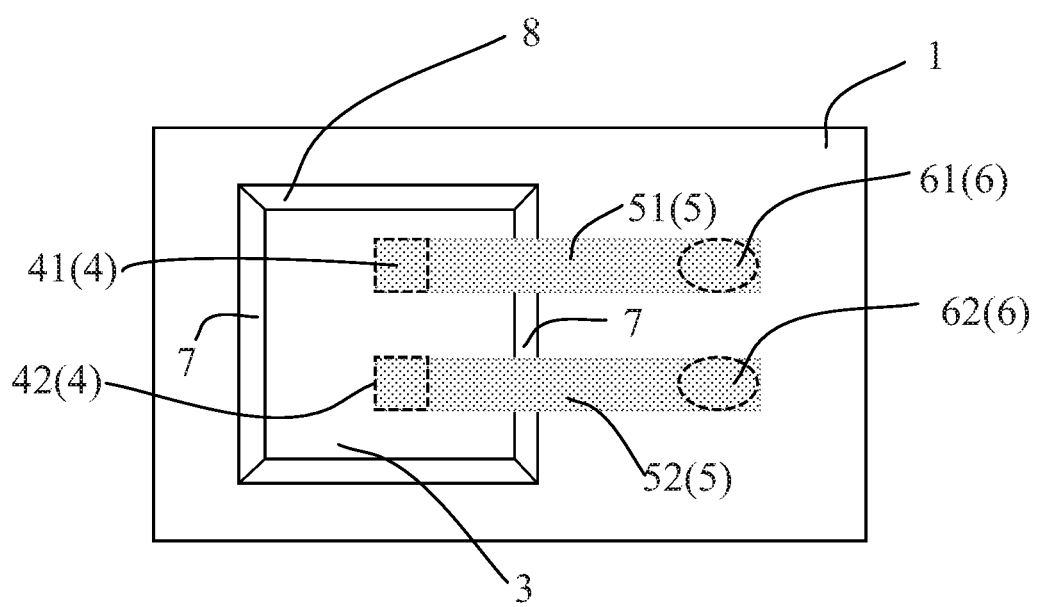

In light of this, an embodiment of the present disclosure provides a display panel, as shown in FIG. 1(a), which is a schematic diagram of a cross-section of the display panel according to an embodiment of the present disclosure. The display panel may include: a substrate; a plurality of driving electrodes 6 and a micro light emitting diode 3 located on a surface of the substrate, where respective electrodes 4 of the micro light emitting diode 3 are located at a side of the micro light emitting diode 3 facing away from the substrate; and a plurality of driving wires 5 respectively electrically coupling the respective electrodes 4 of the micro light emitting diode 3 to the plurality of driving electrodes 6 correspondingly.

For example, as shown in FIG. 1(b), which is a top view of the display panel according to an embodiment of the present disclosure. A positive driving electrode 61, a negative driving electrode 62 and a micro light emitting diode 3 are located on a same surface of the substrate, and a positive electrode 41 and a negative electrode 42 of the micro light emitting diode 3 are located at a side of the micro light emitting diode 3 facing away from the substrate. A positive driving wire 51 electrically couples the positive electrode 41 of the micro light emitting diode 3 to the positive driving electrode 61, and a negative driving wire 52 electrically couples the negative electrode 42 of the micro light emitting diode 3 to the negative driving electrode 62.

According to an embodiment of the present disclosure, the display panel may also include: a buffer structure 7, where the buffer structure 7 covers at least a portion of a sidewall of the micro light emitting diode 3, the plurality of driving wires 5 are located on a side of the buffer structure 7 away from the sidewall of the micro light emitting diode 3, and a surface of at least part of the buffer structure 7 facing the plurality of driving wires 5 is a curved surface.

According to an embodiment of the present disclosure, a surface, facing the plurality of driving wires 5, of a part of the buffer structure 7 contacting a joint between a surface of the micro light emitting diode 3 facing away from the substrate and the sidewall of the micro light emitting diode 3 is a curved surface.

According to an embodiment of the present disclosure, a surface, facing the plurality of driving wires 5, of a part of the buffer structure 7 contacting a joint between the micro light emitting diode 3 and the substrate is a curved surface.

According to an embodiment of the present disclosure, the substrate may include a base 1 and a driving circuit layer 2 in which one or more driving circuits are located, and the plurality of driving electrodes 6 are located on a surface of the driving circuit layer 2 facing away from the base 1.

According to an embodiment of the present disclosure, the display panel may also include a connection structure 8 for fixing the micro light emitting diode 3 to the substrate, where the connection structure 8 is located between the micro light emitting diode 3 and the driving circuit layer 2, and an orthographic projection of the connection structure 8 on the driving circuit layer 2 covers an orthographic projection of the micro light emitting diode 3 on the driving circuit layer 2.

According to an embodiment of the present disclosure, the display panel may also include an alignment electrode (not illustrated in FIGS. 1(a) and 1(b)) located on the surface of the driving circuit layer 2 facing away from the base 1, where the alignment electrode is located within a range of the orthographic projection of the connection structure 8 on the driving circuit layer 2.

According to an embodiment of the present disclosure, any one of the plurality of driving wires 5 at least partly covers one of the respective electrodes 4 to which the any one of the plurality of driving wires 5 is electrically coupled and one of the plurality of driving electrodes 6 corresponding to the one of the respective electrodes 4.

Since the driving electrodes 6 and the micro light emitting diode 3 are disposed at the same side of the substrate, and the plurality of electrodes 4 (anode and cathode) of the micro light emitting diode 3 are located at a side of the micro light emitting diode 3 facing away from the substrate, the plurality of electrodes 4 of the micro light emitting diode 3 and the driving electrodes 6 on the substrate are all exposed, so that one can manufacture the plurality of driving wires 5 respectively coupling the plurality of electrodes 4 to the plurality of driving electrodes 6 using a patterning process. Whether a photolithography process or an etching process is used, the process precision in forming wires is higher than that of bonding process by several orders of magnitude. Furthermore, compared to a related bonding method, the method for fixing the micro light emitting diode 3 onto the substrate used in the display panel according to an embodiment of the present disclosure has low requirements for process precision. In comprehensive consideration of the above factors, for the display panel according to an embodiment of the present disclosure, precision of coupling a electrode 4 to a corresponding driving electrode 6 in the manufacturing process is maximally improved, thereby increasing the yield rate as well.

The display panel according to an embodiment of the present disclosure is described in detail below in conjunction with specific examples. As shown in FIG. 1(a), the display panel may include a base 1, two driving electrodes 6 disposed on the base 1 (FIG. 1(a) only shows one of the two driving electrodes 6), a micro light emitting diode 3 disposed on the base 1, where two electrodes 4 of the micro light emitting diode 3 (FIG. 1(a) only shows one of the two electrodes 4) are both located at a side of the micro light emitting diode 3 facing away from the base 1. As shown in FIG. 1(b), the display panel may also include two driving wires 51, 52 respectively coupling the two electrodes 41, 42 of the micro light emitting diode 3 to the two driving electrodes 61, 62 correspondingly, and any one of the driving wires partly covers or entirely covers the corresponding electrode and the corresponding driving electrode.

According to an embodiment of the present disclosure, the micro light emitting diode 3 may be specifically a transverse micro light emitting diode. At the current viewing angle of FIG. 1(a), its two electrodes 4 (that are, a positive electrode 41 and a negative electrode 42) are both disposed on a top surface of the micro light emitting diode 3. One driving electrode 6 is coupled to the corresponding electrode 4 via one driving wire 5, so that a voltage can be applied between positive and negative electrodes of the micro light emitting diode 3 to cause it to emit light. At the current viewing angle of FIG. 1(b), the positive driving wire 51 electrically couples the positive electrode 41 of the micro light emitting diode 3 to the positive driving electrode 61, and the negative driving wire 52 electrically couples the negative electrode 42 of the micro light emitting diode 3 to the negative driving electrode 62.

According to an embodiment of the present disclosure, any one driving wire 5 may partly cover an electrode 4 corresponding thereto, or may entirely cover the electrode 4 corresponding thereto; any one driving wire 5 may partly cover a driving electrode 6 corresponding thereto, or may entirely cover the driving electrode 6 corresponding thereto.

Since the micro light emitting diode 3 is fixed onto the base 1 in such a way that its two electrodes 4 are disposed on the top surface of the micro light emitting diode 3, that is, the two electrodes 4 are exposed after the micro light emitting diode 3 is transferred to the base 1. At this time, the driving electrodes 6 on the base are also exposed, so that one can manufacture the two driving wires 5 respectively coupling the two electrodes 4 to the two driving electrodes 6 using a patterning process. Whether a photolithography process or an etching process is used, the process precision in forming wires is higher than that of bonding process by several orders of magnitude. Furthermore, compared to a related bonding method, the method for fixing the micro light emitting diode 3 onto the substrate used in the display panel according to an embodiment of the present disclosure has low requirements for process precision. In comprehensive consideration of the above factors, for the display panel according to an embodiment of the present disclosure, precision of coupling a electrode 4 to a corresponding driving electrode 6 in the manufacturing process is maximally improved, thereby increasing the yield rate as well.

According to an embodiment of the present disclosure, the display panel may also include a buffer structure 7, which is at least partly located at a side of the micro light emitting diode 3 in a direction parallel to the base 1, and a side of the driving wire 5 facing the base 1 (between the micro light emitting diode 3 and the driving wire 5). At least part of a surface of the buffer structure 7 facing away from the substrate is a curved surface, for buffering all or part of bending areas of the driving wire 5. For example, an upper surface of a part of the buffer structure 7 in FIG. 1(a) contacting a joint between an upper surface and a sidewall of the micro light emitting diode 3 is convex, and an upper surface of a part of the buffer structure 7 contacting a joint between the micro light emitting diode 3 and the substrate is convex, to increase the bending angle of the driving wire 5 at these positions.

According to an embodiment of the present disclosure, the surface of the buffer structure 7 facing away from the substrate may be a concave surface, a convex surface or a flat surface, an inclination angle with respect to the base 1, of a surface, facing away from the base 1, of a part of the buffer structure 7 adjacent to the base 1 is the smaller the better, and a size of a surface of the buffer structure 7 perpendicular to the base 1 is the smaller the better.

According to an embodiment of the present disclosure, the buffer structure 7 on the left side of FIG. 1(a) may also buffer bending of other structures covering the display panel shown in FIG. 1(a). Less bending helps to improve the yield rate of the driving wire 5, preventing problems of the driving wire 5 being broken or having cracks or being too thin.

According to an embodiment of the present disclosure, the display panel may also include a driving circuit layer 2 (in which one or more driving circuit may be located) located between the base 1 and the driving electrode 6, and the micro light emitting diode 3 is disposed at a side of the driving circuit layer 2 facing away from the base 1.

According to an embodiment of the present disclosure, at least one driving circuit constructed of transistors may be disposed in the driving circuit layer 2, for supplying a driving voltage to the driving electrode 6. In an implementation, the driving circuit layer 2 may be formed on the base 1 first, then the driving electrode 6 may be formed on the driving circuit layer 2, so the driving electrode 6 is disposed on the driving circuit layer 2.

According to an embodiment of the present disclosure, the display panel may also include a connection structure 8 located between the driving circuit layer 2 and the micro light emitting diode 3. The micro light emitting diode 3 is fixed onto the driving circuit layer 2 via the connection structure 8. According to an embodiment of the present disclosure, the connection structure 8 may be made of low temperature curing adhesive. The micro light emitting diode 3 may be fixed onto the driving circuit layer 2 by employing other methods, to which the present disclosure poses no limit.

According to an embodiment of the present disclosure, since the connection structure 8 itself has a certain pattern, in the process of transferring and fixing the micro light emitting diode 3 to the driving circuit layer 2, the connection structure 8 may also serve as an alignment mark.

According to an embodiment of the present disclosure, in the process of transferring and fixing the micro light emitting diode 3 to the driving circuit layer 2, the driving electrode 6 may also serve as an alignment mark.

According to an embodiment of the present disclosure, the display panel may also include an alignment electrode (not illustrated in FIGS. 1(a) and 1(b)) disposed at a side of the base 1 facing towards the micro light emitting diode 3. The alignment electrode functions as an alignment mark in the process of transferring and fixing the micro light emitting diode 3 to the base 1. The alignment electrode may be disposed in the driving circuit layer 2, or may also be disposed at the same layer as the driving electrode 6, as long as, in the process of transferring and fixing the micro light emitting diode 3, a camera of an apparatus can capture the alignment electrode.

It should be noted that, two structures being "disposed in a same layer" means that both of them are formed of the same material layer, thus they are at the same layer in a layered structure, but it does not indicate that they are at the same distance from the base, nor that other layer structures between them and the base are completely the same.

According to an embodiment of the present disclosure, if light from the micro light emitting diode 3 is emitted from a side of the micro light emitting diode 3 having the electrode 4, then a material of the driving wire 5 is preferably a transparent material, such as ITO (Indium tin oxide), IZO (Indium zinc oxide). If light from the micro light emitting diode 3 is emitted from a side of the micro light emitting diode 3 close to the base 1, then the driving wire 5 is preferably made of a light-reflecting material, such as copper, aluminum or the like; and a material of the connection structure 8 is preferably a transparent material, so as to reduce loss of light.

An embodiment of the present disclosure further provides a display device, including the display panel according to embodiments of the present disclosure, and the display device equally has the advantage of high manufacturing yield rate.

According to an embodiment of the present disclosure, the display device may be any product or component having a display function, such as a micro light emitting diode display panel, a micro light emitting diode display module, a mobile phone, a tablet PC, a television, a monitor, a notebook, a digital photo frame, a navigator and the like.

As shown in FIGS. 2-6, an embodiment of the present disclosure further provides a manufacturing method of a display panel, which may include steps 601-603.

In step 601, a plurality of driving electrodes 6 are formed on one surface of a substrate.

According to an embodiment of the present disclosure, before step 601 of forming the plurality of driving electrodes 6 on the surface of the substrate, the method may also include: forming a driving circuit layer 2 on a base 1, to form the substrate; accordingly, forming the plurality of driving electrodes 6 on the surface of the substrate may include: forming the plurality of driving electrodes 6 on a surface of the driving circuit layer 2 facing away from the base 1.

In step 602, the micro light emitting diode 3 is fixed onto the surface of the substrate on which the plurality driving electrodes 6 are formed, where a plurality of electrodes 4 of the micro light emitting diode 3 are located at a side of the micro light emitting diode 3 facing away from the substrate.

According to an embodiment of the present disclosure, before step 602 of fixing the micro light emitting diode 3 onto the surface of the substrate on which the plurality driving electrodes 6 are formed, the method may also include: forming a connection structure 8 for fixing the micro light emitting diode 3 to the substrate on the surface of the driving circuit layer 2 facing away from the base 1 by employing a second patterning process, where an orthographic projection of the connection structure 8 on the driving circuit layer 2 covers an orthographic projection of the micro light emitting diode 3 on the driving circuit layer 2.

According to an embodiment of the present disclosure, step 602 of fixing the micro light emitting diode 3 onto the surface of the substrate on which the plurality driving electrodes 6 are formed, may include: fixing the micro light emitting diode 3 to the driving circuit layer 2 via the connection structure 8, using a pattern of the connection structure 8 as an alignment mark.

According to an embodiment of the present disclosure, step 602 of fixing the micro light emitting diode 3 onto the surface of the substrate on which the plurality driving electrodes 6 are formed, may specifically include: fixing the micro light emitting diode 3 to the driving circuit layer 2 via the connection structure 8, using the plurality of driving electrodes 6 as an alignment mark.

According to an embodiment of the present disclosure, before forming the connection structure 8 on the surface of the driving circuit layer 2 facing away from the base 1 by employing the second patterning process, the method may also include: forming an alignment electrode on the surface of the driving circuit layer 2 facing away from the base 1, where the alignment electrode is located within a range of the orthographic projection of the connection structure 8 on the driving circuit layer 2. Accordingly, step 602 of fixing the micro light emitting diode 3 onto the surface of the substrate on which the plurality driving electrodes 6 are formed, may also include: fixing the micro light emitting diode 3 to the driving circuit layer 2 via the connection structure 8, using the alignment electrode as an alignment mark.

In step 603, a plurality of driving wires 5 are formed by employing a first patterning process, where the plurality of driving wires 5 respectively electrically couple the respective electrodes 4 of the micro light emitting diode 3 to the plurality of driving electrodes 6 correspondingly.

According to an embodiment of the present disclosure, any one of the plurality of driving wires 5 at least partly covers one of the respective electrodes 4 to which the any one of the plurality of driving wires 5 is electrically coupled and one of the plurality of driving electrodes 6 corresponding to the one of the respective electrodes 4.

According to an embodiment of the present disclosure, before step 603 of forming the plurality of driving wires 5 by employing the first patterning process, the method may also include: forming a buffer structure 7; where the buffer structure 7 covers at least a portion of a sidewall of the micro light emitting diode 3, the plurality of driving wires 5 are located on a side of the buffer structure 7 away from the sidewall of the micro light emitting diode 3, and a surface of at least part of the buffer structure 7 facing the plurality of driving wires 5 is a curved surface.

According to an embodiment of the present disclosure, a surface, facing the plurality of driving wires 5, of a part of the buffer structure 7 contacting a joint between a surface of the micro light emitting diode 3 facing away from the substrate and the sidewall of the micro light emitting diode 3 is a curved surface.

According to an embodiment of the present disclosure, a surface, facing the plurality of driving wires 5, of a part of the buffer structure 7 contacting a joint between the micro light emitting diode 3 and the substrate is a curved surface.

For example, an upper surface of a part of the buffer structure 7 in FIG. 1(a) contacting a joint between an upper surface and a sidewall of the micro light emitting diode 3 is convex, and an upper surface of a part of the buffer structure 7 contacting a joint between the micro light emitting diode 3 and the substrate is convex, to increase the bending angle of the driving wire 5 at these positions. The surface of the buffer structure 7 facing away from the substrate may be a concave surface, a convex surface or a flat surface, an inclination angle with respect to the base 1, of a surface facing away from the base 1 of a part of the buffer structure 7 adjacent to the base 1 is the smaller the better, and a size of a surface of the buffer structure 7 perpendicular to the base 1 is the smaller the better.

It is to be noted that, terms "first" and "second" in embodiments of the present disclosure are intended merely to distinguish rather than limit. The first patterning process and the second patterning process may both include but are not limited to a photolithography process, an imprinting process, an inkjet printing process or the like.

Since the driving electrodes 6 and the micro light emitting diode 3 are disposed at the same side of the substrate, and the plurality of electrodes 4 (anode and cathode) of the micro light emitting diode 3 are located at a side of the micro light emitting diode 3 facing away from the substrate, the plurality of electrodes 4 of the micro light emitting diode 3 and the driving electrodes 6 on the substrate are all exposed, so that one can manufacture the plurality of driving wires 5 respectively coupling the plurality of electrodes 4 to the plurality of driving electrodes 6 using a patterning process. Whether a photolithography process or an etching process is used, the process precision in forming wires is higher than that of bonding process by several orders of magnitude. Furthermore, compared to a related bonding method, the method for fixing the micro light emitting diode 3 onto the substrate used in the display panel according to an embodiment of the present disclosure has low requirements for process precision. In comprehensive consideration of the above factors, for the display panel according to an embodiment of the present disclosure, precision of coupling a electrode 4 to a corresponding driving electrode 6 in the manufacturing process is maximally improved, thereby increasing the yield rate as well.

Figure 7:
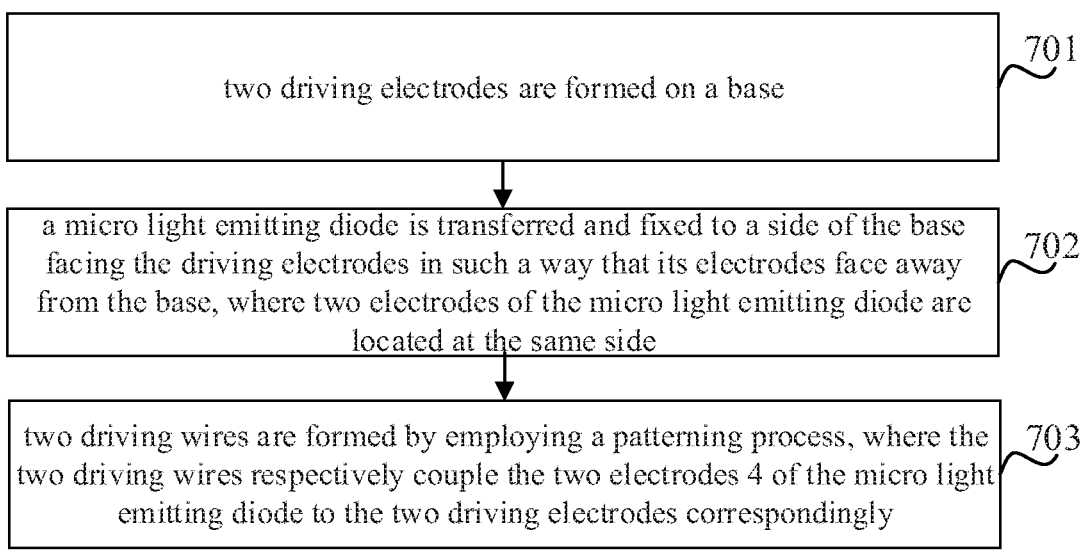
FIG. 7 is another flow chart of the manufacturing method of the display panel according to an embodiment of the present disclosure.

The manufacturing method of the display panel according to an embodiment of the present disclosure is described in detail below in conjunction with specific examples. As shown in FIG. 7, which is another flow chart of the manufacturing method of a display panel according to an embodiment of the present disclosure, the method may include steps 701-703.

In step 701, two driving electrodes 6 are formed on a base 1.

In step 702, a micro light emitting diode 3 is transferred and fixed to a side of the base 1 facing the driving electrodes 6 in such a way that its electrodes 4 face away from the base 1, where two electrodes 4 of the micro light emitting diode 3 are located at a same side.

In step 703, two driving wires 5 are formed by employing a patterning process, where the two driving wires 5 respectively couple the two electrodes 4 of the micro light emitting diode 3 to the two driving electrodes 6 correspondingly.

According to an embodiment of the present disclosure, the patterning process may include but is not limited to a photolithography process, an imprinting process, an inkjet printing process or the like. The photolithography process may include one or more steps of forming a material layer, coating photoresist, exposure, development, etching, peeling of photoresist and the like.

After steps 701 and 702 are completed, the driving electrodes 6 and the electrodes 4 are all nakedly exposed, thus wires for coupling them may be formed using a patterning process, and the precision of coupling can reach 0.6 um-0.8 um, or even lower than 0.6 um.

As shown in FIGS. 1(a)-5, these are schematic diagrams of a flow of the manufacturing method of the display panel according to embodiments of the present disclosure.

Figure 2:
FIG. 2 is a schematic diagram of a structure of the display panel in a first stage of manufacturing according to an embodiment of the present disclosure.

In a first stage of manufacturing, referring to FIG. 2, at first, a driving circuit layer 2 is formed on a base 1, and the driving circuit layer 2 may be formed specifically by employing a low temperature polycrystalline silicon process; after that, driving electrodes 6 may be formed on the driving circuit layer 2 using a patterning process. According to an embodiment of the present disclosure, in the first stage, an alignment mark composed of metal lines may also be formed in the driving circuit layer 2 or outside the driving circuit layer 2.

Figure 3:
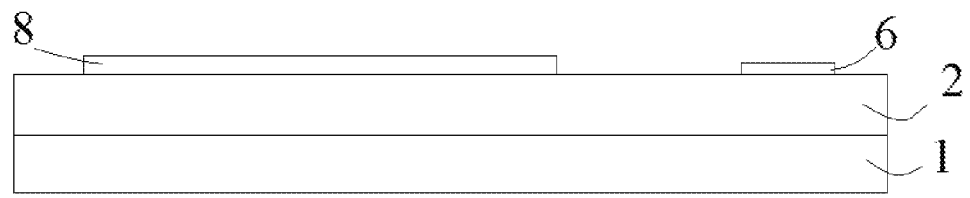
FIG. 3 is a schematic diagram of a structure of the display panel in a second stage of manufacturing according to an embodiment of the present disclosure.

In a second stage of manufacturing, referring to FIG. 3, low temperature curing adhesive is coated on the driving circuit layer 2 by a process like dispensing or screen printing to form a connection structure 8, and the connection structure 8 is used to stick and fix a micro light emitting diode 3 which is subsequently transferred. According to an embodiment of the present disclosure, a pattern of the connection structure 8 itself may also serve as an alignment mark when the micro light emitting diode 3 is transferred and fixed.

Figure 4:
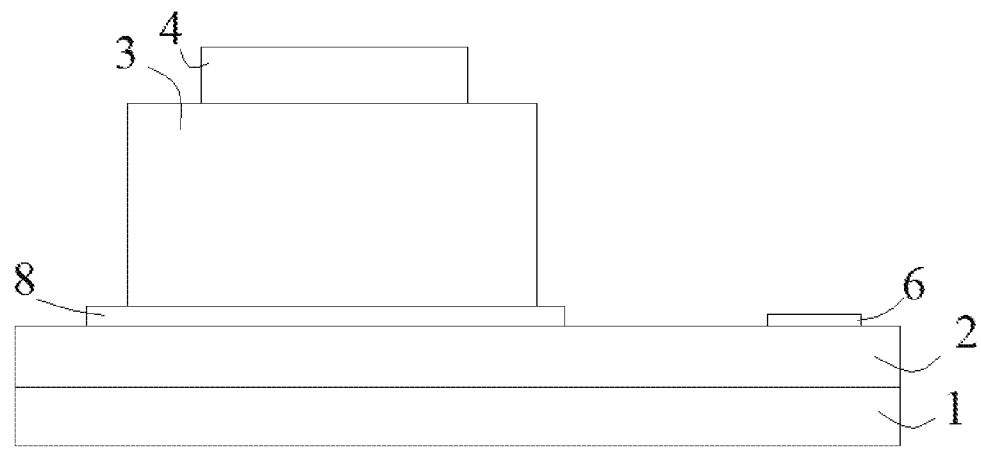
FIG. 4 is a schematic diagram of a structure of the display panel in a third stage of manufacturing according to an embodiment of the present disclosure.

In a third stage of manufacturing, referring to FIG. 4, the micro light emitting diode 3 is transferred from a growing base to the base 1, specifically, transferred to a pattern of the low temperature curing adhesive. If the precision of the low temperature curing adhesive process is sufficiently high, then the pattern of the low temperature curing adhesive itself may be employed as an alignment mark; and if the precision is not enough, then the transfer may be performed using a metal alignment mark. At this time, the anode and the cathode of the micro light emitting diode 3 are facing upward.

Figure 5:
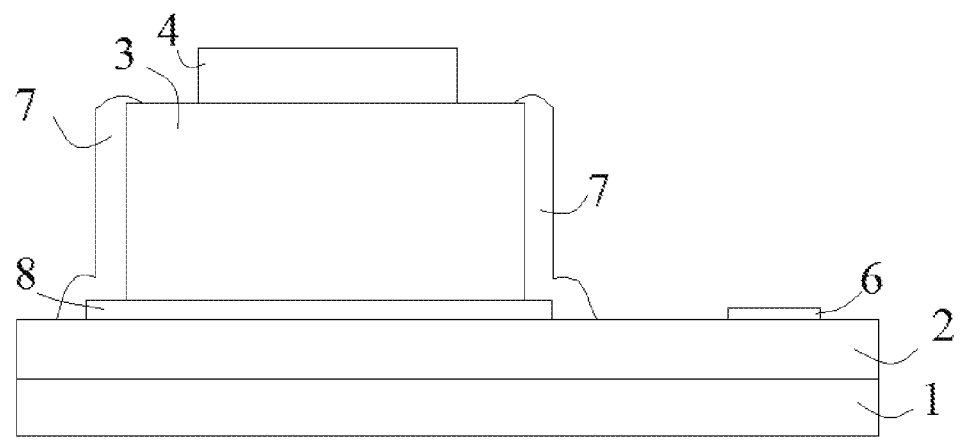
FIG. 5 is a schematic diagram of a structure of the display panel in a fourth stage of manufacturing according to an embodiment of the present disclosure.
Figure 6:
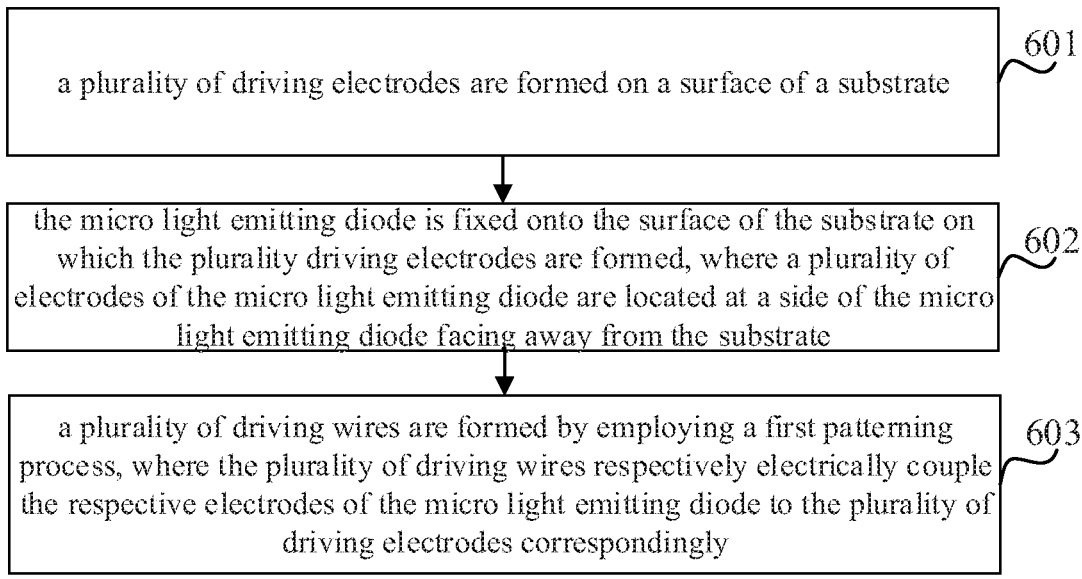
FIG. 6 is a flow chart of a manufacturing method of a display panel according to an embodiment of the present disclosure.

In a fourth stage of manufacturing, referring to FIG. 5, a buffer structure 7 is formed by employing processes of coating a resin material (which, of course, may also be other materials capable of being developed), exposure, development, and curing. A height of the micro light emitting diode 3 is usually about 3 um-10 um, and the buffer structure 7 makes all or part of bending of a plurality of driving wires 5 formed in a subsequent process become smaller, thereby improving yield rate of the plurality of driving wires 5.

In a fifth stage of manufacturing, referring to FIG. 1(b), the plurality of driving wires 5 are formed by processes of sputtering, exposure, development, and etching, which are used to couple the plurality of driving electrodes 6 to the plurality of electrodes 4 respectively in one-to-one correspondence As shown in FIG. 1(b), a positive driving wire 51 couples a positive electrode 41 of the micro light emitting diode 3 to a positive driving electrode 61, and a negative driving wire 52 couples a negative electrode 42 of the micro light emitting diode 3 to a negative driving electrode 62. Since the manufacturing precision of a semiconductor process is far higher than the manufacturing precision of bonding, the precision of coupling between the micro light emitting diode 3 and devices on the base 1 is improved significantly.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display panel, comprising:
    a substrate;
    a plurality of driving electrodes and a micro light emitting diode located on a surface of the substrate, wherein respective electrodes of the micro light emitting diode are located at a side of the micro light emitting diode facing away from the substrate;
    a plurality of driving wires respectively electrically coupling the respective electrodes of the micro light emitting diode to the plurality of driving electrodes;
    a buffer structure covering at least a portion of a sidewall of the micro light emitting diode, wherein the plurality of driving wires are located on a side of the buffer structure away from the sidewall of the micro light emitting diode;
    a surface, facing the plurality of driving wires, of a part of the buffer structure contacting a joint between a surface of the micro light emitting diode facing away from the substrate and the sidewall of the micro light emitting diode is a convex surface; and
    a surface, facing the plurality of driving wires, of a part of the buffer structure contacting a joint between the micro light emitting diode and the substrate is a convex surface.

2. The display panel according to claim 1, wherein the substrate comprises a base and a driving circuit layer, and the plurality of driving electrodes are located on a surface of the driving circuit layer facing away from the base.

3. The display panel according to claim 2, further comprising a connection structure configured to fix the micro light emitting diode to the substrate, wherein the connection structure is located between the micro light emitting diode and the driving circuit layer, and an orthographic projection of the connection structure on the driving circuit layer covers an orthographic projection of the micro light emitting diode on the driving circuit layer.

4. The display panel according to claim 3, further comprising an alignment electrode located on the surface of the driving circuit layer facing away from the base, wherein the alignment electrode is located within the orthographic projection of the connection structure on the driving circuit layer.

5. The display panel according to claim 1, wherein any one of the plurality of driving wires at least partly covers one of the electrodes to which the any one of the plurality of driving wires is electrically coupled and one of the plurality of driving electrodes corresponding to the one of the electrodes.

6. A display device, comprising the display panel according to claim 1.

7. A manufacturing method of a display panel, comprising:
    forming a plurality of driving electrodes on a surface of a substrate;
    fixing a micro light emitting diode onto the surface of the substrate, wherein respective electrodes of the micro light emitting diode are located at a side of the micro light emitting diode facing away from the substrate; and
    forming a plurality of driving wires by employing a first patterning process, wherein the plurality of driving wires respectively electrically couple the respective electrodes of the micro light emitting diode to the plurality of driving electrodes, wherein:
    the method further comprises before forming the plurality of driving wires by employing the first patterning process, forming a buffer structure above the substrate;
    wherein the buffer structure covers at least a portion of a sidewall of the micro light emitting diode, the plurality of driving wires are located on a side of the buffer structure away from the sidewall of the micro light emitting diode, a surface, facing the plurality of driving wires, of a part of the buffer structure contacting a joint between a surface of the micro light emitting diode facing away from the substrate and the sidewall of the micro light emitting diode is a convex surface, and a surface, facing the plurality of driving wires, of a part of the buffer structure contracting a joint between the micro light emitting diode and the substrate is a convex surface.

8. The manufacturing method according to claim 7, before forming the plurality of driving electrodes on the surface of the substrate, further comprising: forming a driving circuit layer on a base to form the substrate;
    wherein forming the plurality of driving electrodes on the surface of the substrate, comprises: forming the plurality of driving electrodes on a surface of the driving circuit layer facing away from the base.

9. The manufacturing method according to claim 8, further comprising: before fixing the micro light emitting diode onto the surface of the substrate, forming a connection structure configured to fix the micro light emitting diode to the substrate on the surface of the driving circuit layer facing away from the base by employing a second patterning process, wherein an orthographic projection of the connection structure on the driving circuit layer covers an orthographic projection of the micro light emitting diode on the driving circuit layer.

10. The manufacturing method according to claim 9, wherein fixing the micro light emitting diode onto the surface of the substrate comprises: fixing the micro light emitting diode to the driving circuit layer via the connection structure by using a pattern of the connection structure as an alignment mark.

11. The manufacturing method according to claim 9, wherein fixing the micro light emitting diode onto the surface of the substrate comprises: fixing the micro light emitting diode to the driving circuit layer via the connection structure by using the plurality of driving electrodes as an alignment mark.

12. The manufacturing method according to claim 9, further comprising: before forming the connection structure on the surface of the driving circuit layer facing away from the base by employing the second patterning process, forming an alignment electrode on the surface of the driving circuit layer facing away from the base, wherein the alignment electrode is located within the orthographic projection of the connection structure on the driving circuit layer.

13. The manufacturing method according to claim 12, wherein fixing the micro light emitting diode onto the surface of the substrate comprises: fixing the micro light emitting diode to the driving circuit layer via the connection structure by using the alignment electrode as an alignment mark.

14. The manufacturing method according to claim 7, wherein any one of the plurality of driving wires at least partly covers one of the electrodes to which the any one of the plurality of driving wires is electrically coupled and one of the plurality of driving electrodes corresponding to the one of the electrodes.

* * * * *